(12) United States Patent
Nishihara

(10) Patent No.: US 7,829,933 B2
(45) Date of Patent: Nov. 9, 2010

(54) SEMICONDUCTOR MEMORY DEVICE AND WRITE METHOD OF THE SAME

(75) Inventor: Kiyohito Nishihara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 349 days.

(21) Appl. No.: 12/016,431

(22) Filed: Jan. 18, 2008

(65) Prior Publication Data

US 2008/0173916 A1  Jul. 24, 2008

(30) Foreign Application Priority Data

Jan. 22, 2007  (JP) .............................. 2007-011877

(51) Int. Cl.
*H01L 29/788* (2006.01)
(52) U.S. Cl. .................. 257/316; 257/E29.129
(58) Field of Classification Search .................. 257/316, 257/E29.129, 321
See application file for complete search history.

(56) References Cited

U.S. PATENT DOCUMENTS 6,531,733 B1 * 3/2003 Jang ............................ 257/315
7,214,587 B2    5/2007 Pinnow et al.
2008/0197400 A1 * 8/2008 Aritome ...................... 257/315

OTHER PUBLICATIONS

Vacuum Sealed Silicon Rich Oxide EEPROM Cell, Nov. 1, 1991, IBM Technical Disclosure Bulletin, vol. 34, Issue 6, pp. 238-241.*
K. Terabe, et al., "Quantized conductance atomic switch", Nature Publishing Group, vol. 433, Jan. 6, 2005, pp. 47-50.

* cited by examiner

*Primary Examiner*—Allan R Wilson
(74) *Attorney, Agent, or Firm*—Oblon, Spivak, McClelland, Maier & Neustadt, L.L.P.

(57) ABSTRACT

A write and erase method of a semiconductor memory device includes a floating gate type transistor having a semiconductor substrate, a gate insulating film formed on the semiconductor substrate, a floating gate electrode formed on the gate insulating film, and a control gate electrode opposing the floating gate electrode with a hollow portion being sandwiched therebetween. A capacitance between the semiconductor substrate and the control gate electrode is controlled by one of an operation of forming, in the hollow portion, an electrical path which electrically connects the floating gate electrode and the control gate electrode, and an operation of eliminating the electrical path.

12 Claims, 6 Drawing Sheets

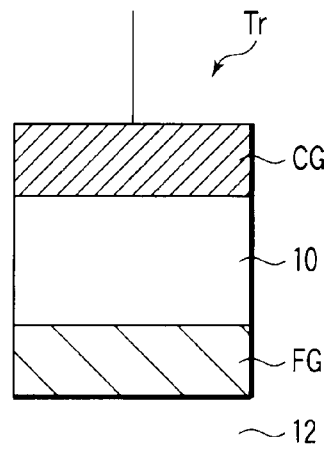
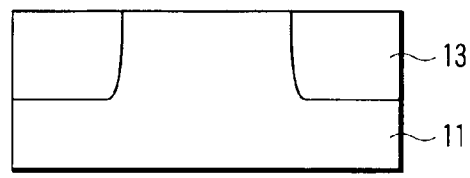
F I G. 1
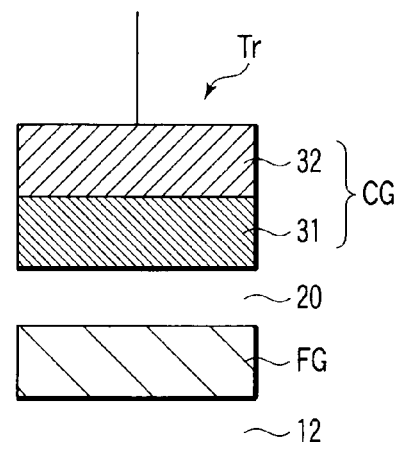
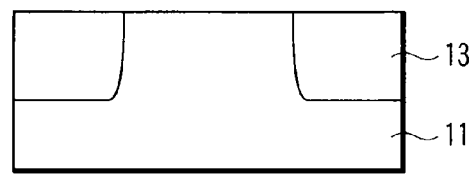
F I G. 2
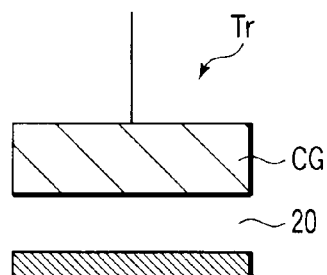
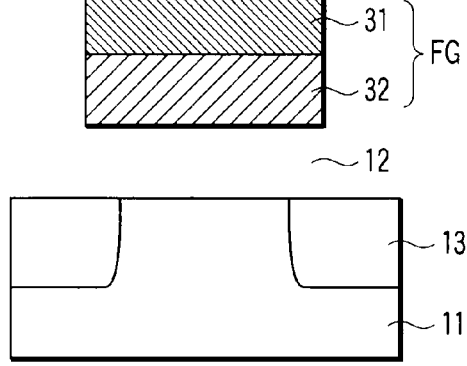
F I G. 3

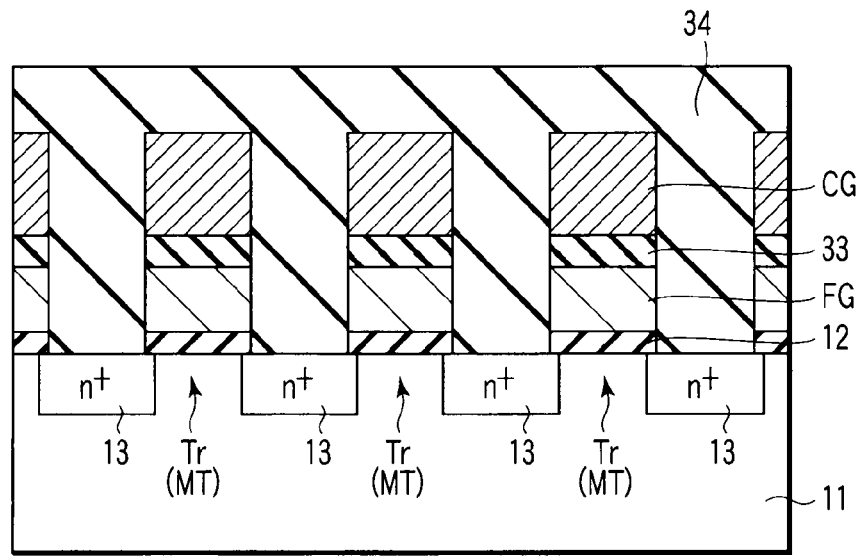
F I G. 6B
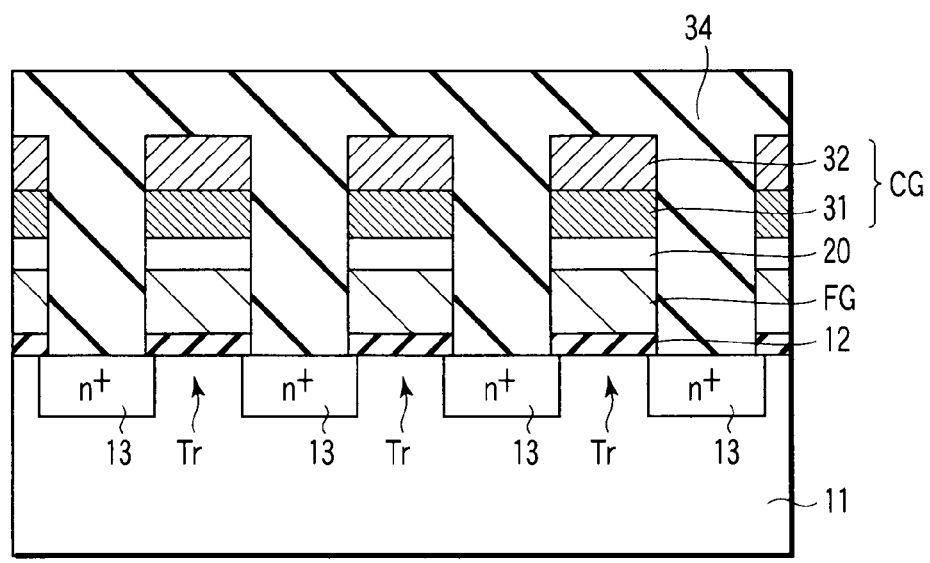
F I G. 7

SEMICONDUCTOR MEMORY DEVICE AND WRITE METHOD OF THE SAME

CROSS-REFERENCE TO RELATED APPLICATIONS

This application is based upon and claims the benefit of priority from prior Japanese Patent Application No. 2007-011877, filed Jan. 22, 2007, the entire contents of which are incorporated herein by reference.

BACKGROUND OF THE INVENTION

1. Field of the Invention

The present invention relates to a floating gate type nonvolatile semiconductor memory device and a write method of the same.

2. Description of the Related Art

In an n-type memory cell of the conventional NAND flash memory having a floating gate, data write, erase, and read are performed as follows.

In data write, a high positive voltage is applied to a control gate electrode to inject electric charge into a floating gate electrode from a channel below the floating gate electrode through a tunnel oxide film by FN tunneling. This increases the threshold voltage of a cell transistor. In data erase, a positive voltage is applied to a substrate to extract electrons from the floating gate electrode to the substrate by FN tunneling. This decreases the threshold voltage of the cell transistor. In data read, the data is discriminated by the amount of electric current when a voltage is applied to an arbitrary control gate electrode.

In the conventional charge storage flash memory as described above, a so-called Yupin effect in which the apparent threshold voltage changes due to the influence of electric charge in an adjacent floating gate electrode is unavoidable, and this Yupin effect deteriorates the operation characteristics of a cell. Also, the Yupin effect occurring in the conventional charge storage transistor becomes notable as the micropatterning of cells advances. This complicates circuit operations, and makes the micropatterning of cells difficult.

Note that prior art reference information related to the present invention is as follows.

[Non-patent Reference 1] K. Terabe, T. Hasegawa, T. Nakayama & M. Aono. Quantized conductance atomic switch. Nature 433, 47-50 (2005)

BRIEF SUMMARY OF THE INVENTION

A write and erase method of a semiconductor memory device according to the first aspect of the present invention comprising a floating gate type transistor having a semiconductor substrate, a gate insulating film formed on the semiconductor substrate, a floating gate electrode formed on the gate insulating film, and a control gate electrode opposing the floating gate electrode with a hollow portion being sandwiched therebetween, wherein a capacitance between the semiconductor substrate and the control gate electrode is controlled by one of an operation of forming, in the hollow portion, an electrical path which electrically connects the floating gate electrode and the control gate electrode, and an operation of eliminating the electrical path.

A semiconductor memory device according to the second aspect of the present invention comprising a floating gate type transistor having a semiconductor substrate, a gate insulating film formed on the semiconductor substrate, a floating gate electrode formed on the gate insulating film, and a control gate electrode opposing the floating gate electrode with a hollow portion being sandwiched therebetween, wherein a capacitance between the semiconductor substrate and the control gate electrode is controlled by one of an operation of forming, in the hollow portion, an electrical path which electrically connects the floating gate electrode and the control gate electrode, and an operation of eliminating the electrical path.

A semiconductor memory device according to the third aspect of the present invention comprising a semiconductor substrate, an insulating layer formed on the semiconductor substrate, an SOI layer formed on the insulating layer, a first gate insulating film formed on an upper surface of the SOI layer, a floating gate electrode formed on the first gate insulating film, a control gate electrode opposing the floating gate electrode with a hollow portion being sandwiched therebetween, a second gate insulating film formed on a lower surface of the SOI layer, a back gate electrode formed below the floating gate electrode so as to sandwich the second gate insulating film, and a diffusion layer formed in the SOI layer between the back gate electrode and the floating gate electrode.

BRIEF DESCRIPTION OF THE SEVERAL VIEWS OF THE DRAWING

FIG. 1 is a sectional view showing the basic structure of a memory cell of a semiconductor memory device according to an embodiment of the present invention;

FIG. 2 is a sectional view showing a memory cell of a semiconductor memory device according to an embodiment of the present invention;

FIG. 3 is a sectional view showing another memory cell of the semiconductor memory device according to the embodiment of the present invention;

FIG. 6B is a sectional view taken along a line VIB-VIB in FIG. 6A;

FIG. 7 is a sectional view showing a memory cell array of a NAND flash memory according to the first embodiment of the present invention;

DETAILED DESCRIPTION OF THE INVENTION

Figure 4:
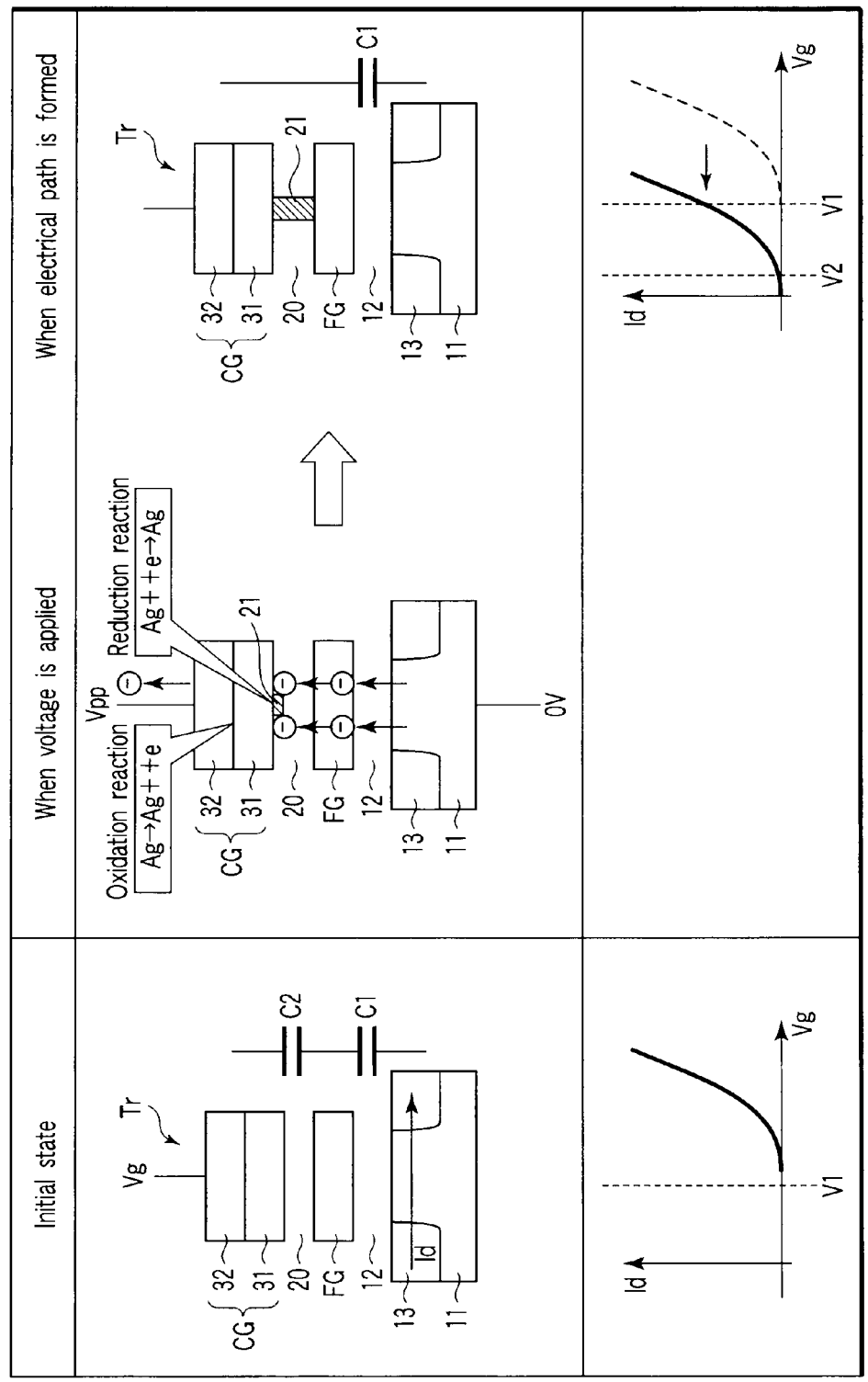
FIG. 4 is a schematic view for explaining the first write method of the semiconductor memory device according to the embodiment.

Embodiments of the present invention will be explained below with reference to the accompanying drawing. In the following explanation, the same reference numerals denote the same parts throughout the drawing.

An embodiment of the present invention to be explained below is applicable to a nonvolatile semiconductor memory device, e.g., a floating gate type flash EEPROM.

[1] Basic Structure

FIG. 1 is a sectional view showing the basic structure of a memory cell of a semiconductor memory device according to the embodiment of the present invention. The basic structure of the memory cell of the semiconductor memory device according to the embodiment of the present invention will be explained below.

As shown in FIG. 1, a gate insulating film 12 is formed on a semiconductor substrate 11, and source/drain diffusion layers 13 are formed in the semiconductor substrate 11. A floating gate electrode FG is formed on the gate insulating film 12. A control gate electrode CG is formed above the floating gate electrode FG so as to oppose it. An interlayer portion 10 is formed between the floating gate electrode FG and control gate electrode CG.

A transistor Tr having the basic structure as described above is used in, e.g., a floating gate type memory cell. While the conventional floating gate type flash memory uses a charge storage transistor, this embodiment uses a non-charge storage transistor.

That is, in the conventional device, the threshold value of the cell transistor is controlled by manipulating the charge amount in the floating gate electrode by injecting electric charge into and discharging electric charge from the floating gate electrode. In this embodiment, however, the threshold value of a memory cell is controlled not by manipulating the charge amount in the floating gate electrode FG, but by manipulating the capacitance between the control gate electrode CG and the semiconductor substrate 11 of the cell transistor Tr by controlling the generation and elimination of an electrical path between the floating gate electrode FG and control gate electrode CG.

To implement the non-charge storage transistor Tr as described above, the interlayer portion 10 sandwiched between the control gate electrode CG and floating gate electrode FG is given a structure capable of exchanging electric charge with the electrodes CG and FG on the two sides. More specifically, the following structure is desirable.

(a) The interlayer portion 10 desirably comprises a solid electrolyte layer and hollow portion, and largely changes its resistance value (insulator ⇔ conductor) by exchanging electric charge with the control gate electrode CG and floating gate electrode FG.

(b) The solid electrolyte is desirably $Ag_2S$, $Ag_2Se$, $Cu_2S$, or $Cu_2Se$.

[2] Embodiment

The structures and operations of the transistor Tr according to an embodiment for implementing the above basic structure will be explained below.

[2-1] Structures

FIGS. 2 and 3 are sectional views of memory cells of a semiconductor memory device according to the embodiment of the present invention. The structures of the memory cells of the semiconductor memory device according to the embodiment of the present invention will be explained below.

In the structure shown in FIG. 2, a gate insulating film 12 is formed on a semiconductor substrate 11, and source/drain diffusion layers 13 are formed in the semiconductor substrate 11. A floating gate electrode FG is formed on the gate insulating film 12, and a control gate electrode CG is formed above the floating gate electrode FG. The control gate electrode CG comprises a solid electrolyte layer 31 made of a solid electrolyte, and a conductive layer 32 made of a conductive material. The solid electrolyte layer 31 is formed in the lower portion (on the side of a hollow portion 20), and the conductive layer 32 is formed in the upper portion. The solid electrolyte layer 31 and conductive layer 32 are in contact with each other. The hollow portion 20 is formed between the solid electrolyte layer 31 and floating gate electrode FG.

In the structure shown in FIG. 3, a gate insulating film 12 is formed on a semiconductor substrate 11, and source/drain diffusion layers 13 are formed in the semiconductor substrate 11. A floating gate electrode FG is formed on the gate insulating film 12, and a control gate electrode CG is formed above the floating gate electrode FG. The floating gate electrode FG comprises a solid electrolyte layer 31 made of a solid electrolyte, and a conductive layer 32 made of a conductive material. The solid electrolyte layer 31 is formed in the upper portion (on the side of a hollow portion 20), and the conductive layer 32 is formed in the lower portion. The solid electrolyte layer 31 and conductive layer 32 are in contact with each other. The hollow portion 20 is formed between the solid electrolyte layer 31 and control gate electrode CG.

Referring to FIG. 2, the solid electrolyte layer 31 of the control gate electrode CG is made of $Ag_2S$, $Ag_2Se$, $Cu_2S$, or $Cu_2Se$, and the conductive layer 32 of the control gate electrode CG is made of a cation metal element of the solid electrolyte layer 31. The floating gate electrode FG is made of a conductive material. When silver sulfide ($Ag_2S$) is used as the solid electrolyte layer 31, for example, the conductive layer 32 is silver (Ag), and the floating gate electrode FG is one of Al, Cu, Pt, Au, Ag, W, Ni, Co, and poly-Si.

Referring to FIG. 3, the solid electrolyte layer 31 of the floating gate electrode FG is made of $Ag_2S$, $Ag_2Se$, $Cu_2S$, or $Cu_2Se$, and the conductive layer 32 of the floating gate electrode FG is made of a cation metal element of the solid electrolyte layer 31. The control gate electrode CG is made of a conductive material. When silver sulfide ($Ag_2S$) is used as the solid electrolyte layer 31, for example, the conductive layer 32 is silver (Ag), and the control gate electrode CG is one of Al, Cu, Pt, Au, Ag, W, Ni, Co, and poly-Si.

The solid electrolyte layer 31 and conductive layer 32 may have the same film thickness or different film thicknesses. The film thicknesses of the solid electrolyte layer 31 and conductive layer 32 are desirably, e.g., 2 to 200 nm.

The hollow portion 20 is desirably evacuated or filled with an inert gas. Examples of the inert gas are nitrogen ($N_2$), argon (Ar), xenon (Xe), and neon (Ne).

The width of the hollow portion 20 (the distance between the floating gate electrode FG and control gate electrode CG) is preferably 2 nm or more. This is so because if the width has this value, no direct tunneling occurs, and FN tunneling occurs when an electric field of about 7 MeV/cm is generated between the floating gate electrode FG and control gate electrode CG.

An example of the material of the gate insulating film 12 is $SiO_2$.

Note that in actual device construction, the width of the hollow portion 20 is preferably 2 to 10 nm when the write characteristics and reliability are taken into consideration. Note also that the width of the hollow portion 20 is preferably 4 to 10 nm when $SiO_2$ is used as the gate insulating film 12.

[2-2] Write Operations

Write operations will be explained below by taking the case where silver sulfide ($Ag_2S$) is used as the solid electrolyte layer 31 and silver (Ag) is used as the conductive layer 32 as an example.

(First Write Operation)

The first write operation is an operation of forming an electrical path from the state in which the hollow portion 20 has no electrical path. That is, this operation increases the capacitance between the control gate electrode CG and the semiconductor substrate 11 of the cell transistor Tr, and decreases a threshold voltage Vth of the cell transistor Tr.

FIG. 4 is a schematic view for explaining the first write operation of the semiconductor memory device according to the embodiment of the present invention. The first write operation of the semiconductor memory device according to the embodiment of the present invention will be explained below.

First, the initial state will be explained. In the initial state, the hollow portion 20 between the floating gate electrode FG and control gate electrode CG has no electrical path. Therefore, two series-connected capacitors C1 and C2 exist. That is, the parallel plate capacitor C1 is formed between the floating gate electrode FG and semiconductor substrate 11, and the parallel plate capacitor C2 is formed between the floating gate electrode FG and control gate electrode CG.

In the initial state as described above, no electric current Id flows unless a voltage higher than a predetermine value V1 is applied to the control gate electrode CG, as indicated by an Id-Vg curve. That is, the threshold voltage V1 of the transistor Tr is held high.

Next, the state when a voltage is applied will be explained. To apply a voltage higher than that of the semiconductor substrate 11 to the control gate electrode CG, the semiconductor substrate 11 is set at 0V, and a positive voltage Vpp is applied to the control gate electrode CG. The positive voltage Vpp is a voltage (e.g., 20V) sufficient to cause FN tunneling of electrons between the floating gate electrode FG and semiconductor substrate 11, and between the floating gate electrode FG and control gate electrode CG.

When the voltage application described above is performed, electrons e flowing from the semiconductor substrate 11 or floating gate electrode FG to the control gate electrode CG enter the solid electrolyte layer ($Ag_2S$) 31. This causes a reduction reaction of silver on that surface of the solid electrolyte layer ($Ag_2S$) 31, which is in contact with the hollow portion 20, and silver atoms deposit. That is, a silver atom filament 21 is formed on that surface of the solid electrolyte layer ($Ag_2S$) 31, which is in contact with the hollow portion 20.

When the electrons e are kept injected into the solid electrolyte layer ($Ag_2S$) 31, the silver atoms keep depositing. In this state, the conductive layer (Ag) 32 supplies silver to make up for the deficiency of silver in the solid electrolyte layer ($Ag_2S$) 31. The silver atom filament 21 grows toward the floating gate electrode FG, and eventually comes in contact with the floating gate electrode FG. In this state, the floating gate electrode FG and control gate electrode CG are electrically connected. This operation is performed using the same phenomenon as described in non-patent reference 1, and the contact state is maintained even after the voltage application.

In this electrical path formation, the parallel plate capacitor C1 between the floating gate electrode FG and semiconductor substrate 11 is the capacitor between the control gate electrode CG and semiconductor substrate 11. In the electrical path formation, therefore, the capacitance between the control gate electrode CG and the semiconductor substrate 11 of the cell transistor Tr increases from that in the initial state. Accordingly, as indicated by the Id-Vg curve, the electric current Id flows through the control gate electrode CG by the application of a voltage V2 lower than the voltage V1.

As described above, the first write operation forms the electrical path (silver atom filament 21) in the hollow portion 20. Consequently, the Id-Vg curve shifts in the negative direction, and the threshold value Vth of the cell transistor Tr decreases. Note that this change in Id-Vg curve has the same effect as that of erase in the charge storage flash memory.

(Second Write Operation)

The second write operation is an operation of eliminating an electrical path from the state in which the electrical path exists in the hollow portion 20. That is, the second write operation reduces the capacitance between the control gate electrode CG and the semiconductor substrate 11, and raises the threshold voltage Vth of the cell transistor Tr.

Figure 5:
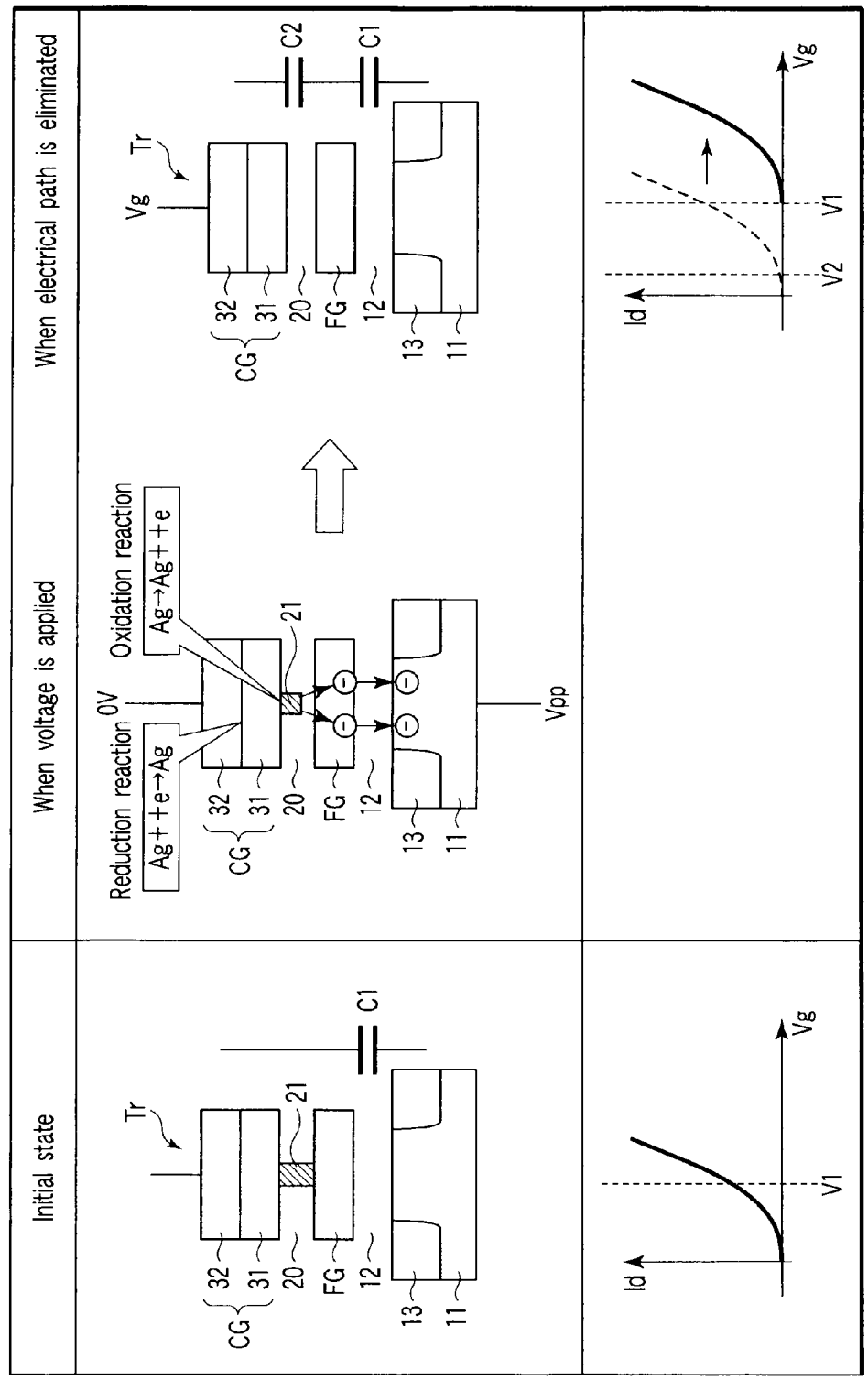
FIG. 5 is a schematic view for explaining the second write method of the semiconductor memory device according to the embodiment.

FIG. 5 is a schematic view for explaining the second write operation of the semiconductor memory device according to the embodiment of the present invention. The second write operation of the semiconductor memory device according to the embodiment of the present invention will be explained below.

First, the initial state will be explained. In the initial state, the electrical path (silver atom filament 21) is formed in the hollow portion 20 between the floating gate electrode FG and control gate electrode CG. Therefore, the parallel plate capacitor C1 is formed between the floating gate electrode FG and semiconductor substrate 11.

In the initial state as described above, the threshold voltage V2 of the transistor Tr is lower than the threshold voltage V1 as indicated by the Id-Vg curve.

The state when a voltage is applied will now be explained. To apply a voltage higher than that of the control gate electrode CG to the semiconductor substrate 11, the control gate electrode CG is set at 0V, and the positive voltage Vpp is applied to the semiconductor substrate 11. The positive voltage Vpp is a voltage (e.g., 20V) sufficient to extract the electrons e from the floating gate electrode FG to the semiconductor substrate 11.

When the voltage application described above is performed, a reduction reaction occurs in the interface between the conductive layer (Ag) 32 and solid electrolyte layer ($Ag_2S$) 31, and an oxidation reaction occurs in the interface between the silver atom filament 21 and solid electrolyte layer ($Ag_2S$) 31. As a consequence, the silver atom filament 21 dissolves in the solid electrolyte layer ($Ag_2S$) 31.

When the electrons e are kept injected into the semiconductor substrate 11, the silver atom filament 21 disappears toward the control gate electrode CG. Accordingly, the electrical path between the floating gate electrode FG and control gate electrode CG disappears, so the floating gate electrode FG and control gate electrode CG are electrically insulated.

When the electrical path disappears, two series-connected capacitors C1 and C2 are formed. That is, the parallel plate capacitor C1 is formed between the floating gate electrode FG and semiconductor substrate 11, and the parallel plate capacitor C2 is formed between the floating gate electrode FG and control gate electrode CG. When the electrical path disappears, therefore, the capacitance between the control gate electrode CG and the semiconductor substrate 11 of the cell transistor Tr reduces from that in the initial state. Accordingly, as indicated by the Id-Vg curve, the threshold voltage Vth of the cell transistor Tr rises.

As described above, the second write operation eliminates the electrical path (silver atom filament 21) from the hollow portion 20. Consequently, the Id-Vg curve shifts in the positive direction, and the threshold value Vth of the cell transistor Tr increases. Note that this change in Id-Vg curve has the same effect as that of write in the charge storage flash memory.

[2-3] Read Operation

This embodiment increases and decreases the capacitance between the control gate electrode CG and the semiconductor substrate 11 of the cell transistor Tr by controlling the generation and elimination of the electrical path between the floating gate electrode FG and control gate electrode CG. As a result, the threshold voltage Vth of the cell transistor Tr also changes.

In the read operation, therefore, this phenomenon is used to discriminate data by the current amount Id when a voltage is applied to the control gate electrode CG.

[2-4] Application to Nonvolatile Memory Devices

The cases where the above-mentioned memory cell transistor is applied to NAND nonvolatile memory devices will be explained below.

First Embodiment

Figure 6A:
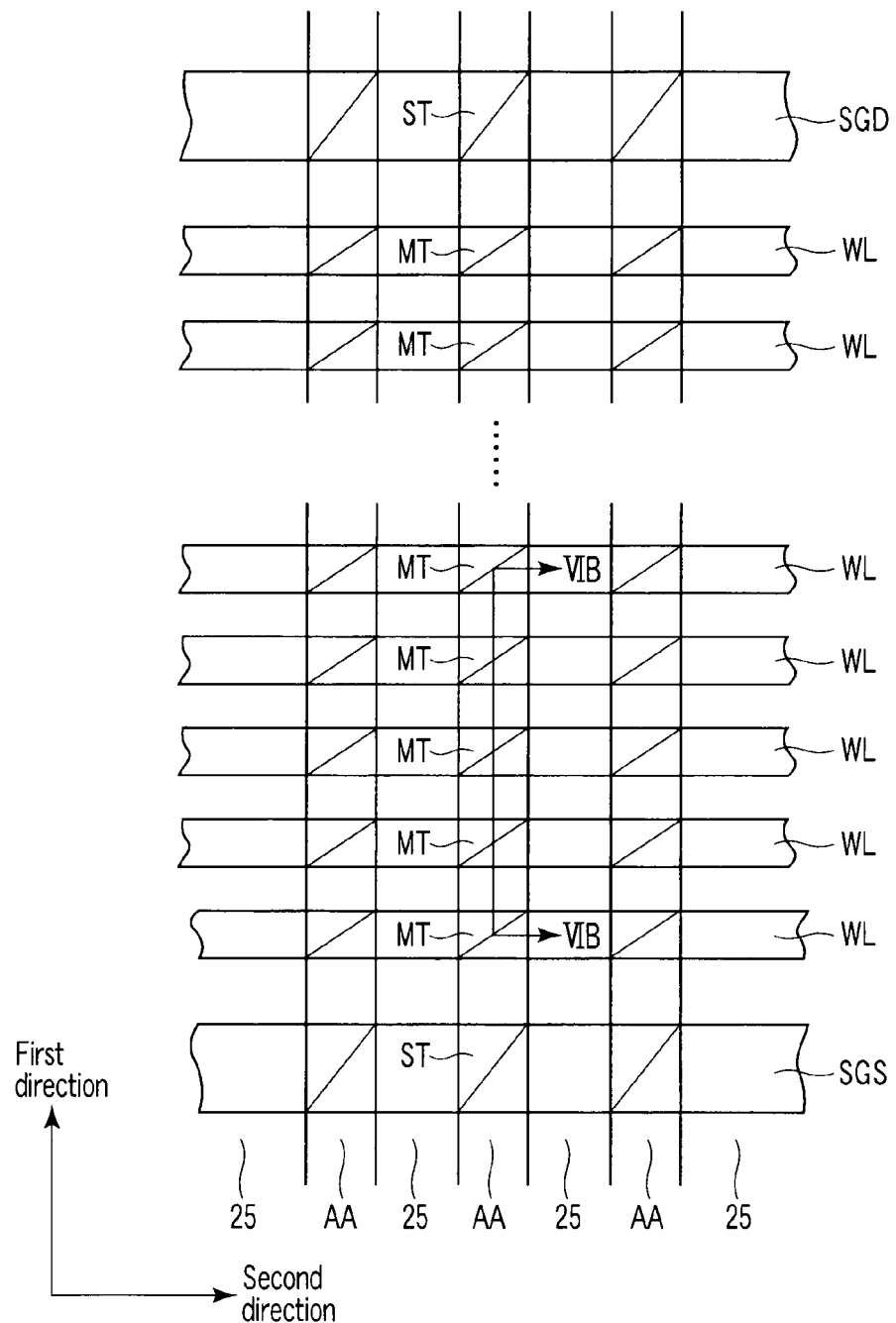
FIG. 6A is a plan view showing a memory cell array of a NAND flash memory according to prior art.

FIGS. 6A and 6B are views showing three adjacent cells in a memory cell array of a NAND flash memory according to prior art. FIG. 7 is a sectional view showing three adjacent cells in a memory cell array of a NAND flash memory according to the first embodiment to which the non-charge storage memory cell of the present invention is applied.

As shown in FIG. 6A, an element isolating region 25 extended in the first direction is arranged in the plural in the second direction with a predetermine space. An active region AA extended in the first direction so that it may be isolated by this element isolating region 25 is formed. Word lines WL extended in the second direction are arranged with a predetermine space. Select gate lines SGD and SGS are arranged to put these word lines. A memory cell MT is formed by each of intersection the active regions AA and word lines WL. A select gate transistor ST is formed by each of intersection the active regions AA and the select gate lines SGD and SGS.

As shown in FIG. 6B, each memory cell of the prior art is a charge storage transistor Tr having a floating gate electrode FG. An insulating layer 33 about 10 nm thick exists between a control gate electrode CG and the floating gate electrode FG. Also, an interlayer dielectric layer 34 insulates the individual memory cells. The interlayer dielectric layer 34 is made of, e.g., $SiO_2$.

The non-charge storage memory cell (FIG. 2 or 3) of the present invention proposed in this specification can be applied to the NAND nonvolatile memory according to the prior art as described above by only replacing each memory cell of the conventional NAND flash memory shown in FIGS. 6A and 6B with the memory cell shown in FIG. 2 or 3.

That is, as shown in FIG. 7, a control gate electrode CG comprises a solid electrolyte layer 31 and conductive layer 32, and a hollow portion 20 is formed between the control gate electrode CG and a floating gate electrode FG.

Note that each memory cell shown in FIG. 7 has the structure shown in FIG. 2, but it may also have the structure shown in FIG. 3.

Second Embodiment

In the NAND nonvolatile memory device shown in FIG. 7 to which the non-charge storage memory cell is applied, the same NAND cell array sometimes includes both a cell in which the control gate electrode CG and floating gate electrode FG are electrically connected by a metal filament, and a cell in which the control gate electrode CG and floating gate electrode FG are not electrically connected. The former will be called a "written" cell, and the latter will be called "an erased" cell.

In data write and read, a voltage Vpass or Vread is applied to the control gate electrode CG of an unselected cell in the conventional charge storage memory cell array. In the non-charge storage memory cell array of this embodiment, however, the voltages Vpass and Vread are applied between a substrate 11 and the floating gate electrode FG of an unselected "written" cell.

Generally, voltage Vpass=8 to 12V and voltage Vread=4 to 6V in the conventional NAND device. In this case, data write is particularly a problem in this embodiment. More specifically, if FN tunneling occurs between the substrate 11 and floating gate electrode FG due to the voltage Vpass in an unselected "written" cell, the channel potential of a selected NAND cell array to be set at 0V rises, and the electric field between the substrate 11 and floating gate electrode FG reduces in a selected cell. This may make data write impossible.

In the conventional NAND device, insulating films 12 and 33 are made of $SiO_2$, and the film thickness of the insulating films 12 and 33 is appropriately about 10 nm. However, FN tunneling occurs if a voltage Vpass of 8 to 12V is applied between the substrate 11 and floating gate electrode FG. No FN tunneling occurs if it is possible to reduce the voltage Vpass to, e.g., about 5V. Unfortunately, this reduces the rise of the channel potential in an unselected cell array. If a cell including a selected word line in the unselected cell array is an "erased" cell, FN tunneling occurs between the control gate electrode CG and floating gate electrode FG, and between the substrate 11 and floating gate electrode FG. This may cause unwanted data write.

Accordingly, in the NAND device using the non-charge storage memory cell of this embodiment proposed in this specification, a structure capable of controlling the channel of an unselected cell by an electrode other than the control gate electrode CG of the unselected cell is more desirable from the operational viewpoint than the conventional method that turns on the channel of an unselected cell by applying the voltages Vpass and Vread to the control gate electrode CG of the unselected cell.

Figure 8:
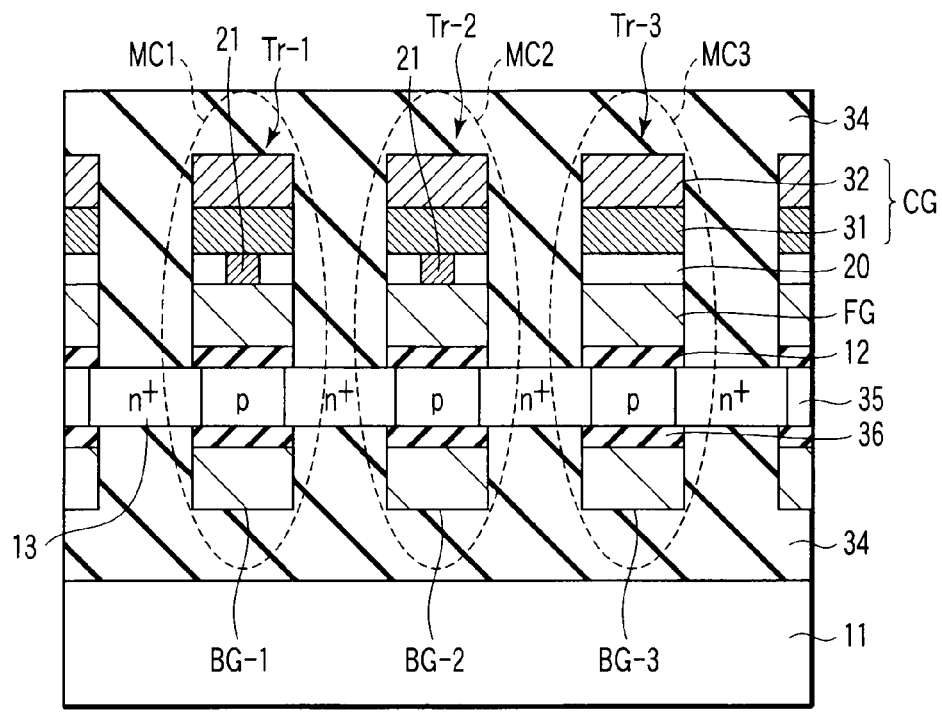
FIG. 8 is a sectional view showing a memory cell array of a NAND flash memory according to the second embodiment of the present invention.

As a device structure capable of the operation like this, a structure having a back gate and an operation method of the structure are possible. FIG. 8 shows this device structure.

As shown in FIG. 8, an SOI (Silicon On Insulator) layer 35 is formed above a semiconductor substrate 11. The SOI layer 35 has a film thickness of, e.g., about 5 to 100 nm, and is made of, e.g., single-crystal Si or poly-Si. The gate stack structure shown in FIG. 2 or 3 is formed on the SOI layer 35 (the structure shown in FIG. 2 is used in FIG. 8).

Transistors Tr-1, Tr-2, and Tr-3 of memory cells MC1, MC2, and MC3 respectively have back gates BG-1, BG-2, and BG-3 immediately below the gate stack structures so as to sandwich insulating films 36 between them. The insulating films 36 have a film thickness of, e.g., about 4 to 100 nm, and are made of, e.g., $SiO_2$. Examples of the material of the back gates BG-1, BG-2, and BG-3 are Al, Cu, Pt, Au, Ag, W, Ni, Co, and poly-Si. The film thickness of the back gates BG-1, BG-2, and BG-3 is, e.g., about 10 to 1,000 nm.

Diffusion layers 13 are formed from the upper surface to the lower surface of the SOI layer 35. The substrate 11 and back gates BG-1, BG-2, and BG-3 have a spacing of, e.g., 30 to 100 nm, and are insulated by an interlayer dielectric layer 34.

Figure 9:
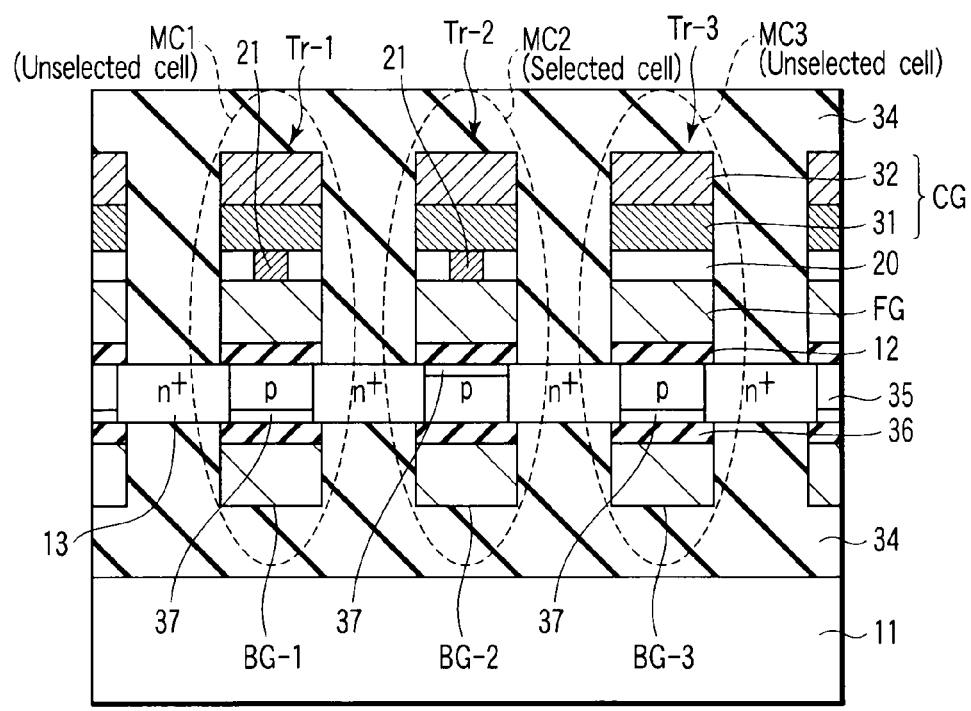
FIG. 9 is a view for explaining the write operation of the NAND flash memory according to the second embodiment of the present invention.

A write operation will be explained below with reference to FIG. 9. The memory cells MC1 and MC2 are "written" cells, and the memory cell MC3 is an "erased" cell. An operation of writing data in the memory cell MC2 will be explained below.

First, a voltage Vpass of, e.g., 4 to 6V is applied to the back gates BG-1 and BG-3 of the unselected cells MC1 and MC3.

Consequently, channels 37 are formed in the lower portions of the SOI layers 35 of the memory cells MC1 and MC3.

Then, a voltage Vpgm of, e.g., 20V is applied to the conductive layer 32 of the control gate electrode CG of the selected cell MC2. In this state, 0V is transferred from a bit line to the diffusion layer 13 and channel 37 of the selected cell MC2 via the channels 37, which are formed by the application of the back gate voltage, of the unselected cells MC1 and MC2, thereby making data write possible. That is, data can be written in the selected memory cell MC2 without applying the voltage Vpass to the control gate electrode CG of the unselected "written" cell MC1.

In this embodiment as described above, the above-mentioned write operation is performed using memory cells having back gates. Even when an unselected cell is a "written" cell, therefore, the voltage Vpass need not be applied to the control gate electrode CG of this unselected cell, so no electrons are injected into the floating gate electrode FG of the unselected cell. This eliminates the possibility of a write error in a selected cell.

Effects of Embodiments

In the embodiment of the present invention described above, an electrical path is generated or eliminated between the floating gate electrode FG and control gate electrode CG by adjusting the application voltage between the control gate electrode CG and semiconductor substrate 11. This increases or decreases the capacitance between the control gate electrode CG and semiconductor substrate 11, thereby controlling the threshold voltage Vth. Thus, the embodiment of the present invention can implement the non-charge storage transistor. Therefore, the Yupin effect occurring in the conventional charge storage transistor does not essentially occur in this embodiment. This makes it possible to neglect the threshold fluctuation caused by the influence of electric charge between adjacent cells.

Also, the Yupin effect occurring in the conventional charge storage transistor becomes conspicuous as the micropatterning of cells progresses. This complicates circuit operations and imposes limitations on the micropatterning. However, this embodiment can avoid these conventional problems because no Yupin effect occurs.

Furthermore, in the conventional charge storage transistor, it is necessary to set a sufficient coupling ratio in order to well inject electrons into the floating gate electrode and well discharge electrons from the floating gate electrode. Therefore, each memory cell must have a three-dimensional structure, and this makes processing complicated and difficult. Consequently, not only the Yupin effect limits the micropatterning of memory cells, but also the process dispersion and the process cost unavoidably increases. By contrast, the operation of this embodiment can be performed by a parallel plate capacitor structure. A planar cell structure can simplify the processing, and reduce the process dispersion and the process cost.

Note that this embodiment is applicable to both NAND and NOR flash memories.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A write and erase method of a semiconductor memory device comprising a floating gate type transistor having:
   a semiconductor substrate;
   a gate insulating film formed on the semiconductor substrate;
   a floating gate electrode formed on the gate insulating film; and
   a control gate electrode opposing the floating gate electrode with a hollow portion being sandwiched therebetween,
   wherein one of the floating gate electrode and the control gate electrode includes a solid electrolyte layer touching the hollow portion, and a conductive layer in contact with the solid electrolyte layer.

2. The method according to claim 1, wherein
   a material of the solid electrolyte layer is one of $Ag_2S$, $Ag_2Se$, $Cu_2S$, and $Cu_2Se$, and
   the conductive layer is made of a cation metal element of the material of the solid electrolyte layer.

3. The method according to claim 1, wherein the hollow portion is one of a vacuum portion and a portion filled with an inert gas.

4. The method according to claim 1, wherein the semiconductor memory device comprises an EEPROM.

5. The method according to claim 1, wherein a capacitance between the semiconductor substrate and the control gate electrode is controlled by one of an operation of forming, in the hollow portion, an electrical path which electrically connects the floating gate electrode and the control gate electrode, and an operation of eliminating the electrical path.

6. The method according to claim 5, wherein
   one of the formation and the elimination of the electrical path is performed by applying a voltage between the control gate electrode and the semiconductor substrate.

7. The method according to claim 5, wherein
   the capacitance is increased by forming the electrical path in the hollow portion by applying a voltage higher than that of the semiconductor substrate to the control gate electrode, and
   the capacitance is decreased by eliminating the electrical path from the hollow portion by applying a voltage higher than that of the control gate electrode to the semiconductor substrate.

8. A semiconductor memory device comprising a floating gate type transistor having:
   a semiconductor substrate;
   a gate insulating film formed on the semiconductor substrate;
   a floating gate electrode formed on the gate insulating film; and
   a control gate electrode opposing the floating gate electrode with a hollow portion being sandwiched therebetween,
   wherein one of the floating gate electrode and the control gate electrode includes a solid electrolyte layer touching the hollow portion, and a conductive layer in contact with the solid electrolyte layer.

9. The device according to claim 8, wherein
   a material of the solid electrolyte layer is one of $Ag_2S$, $Ag_2Se$, $Cu_2S$, and $Cu_2Se$, and
   the conductive layer is made of a cation metal element of the material of the solid electrolyte layer.

10. The device according to claim 8, wherein the hollow portion is one of a vacuum portion and a portion filled with an inert gas.

11. The device according to claim 8, wherein the semiconductor memory device comprises an EEPROM.

12. The device according to claim 8, wherein a capacitance between the semiconductor substrate and the control gate electrode is controlled by one of an operation of forming, in the hollow portion, an electrical path which electrically connects the floating gate electrode and the control gate electrode, and an operation of eliminating the electrical path.

* * * * *